(12) United States Patent
Baumgarter et al.

(10) Patent No.: US 7,360,185 B2
(45) Date of Patent: Apr. 15, 2008

(54) DESIGN VERIFICATION USING SEQUENTIAL AND COMBINATIONAL TRANSFORMATIONS

(75) Inventors: Jason Raymond Baumgarter, Austin, TX (US); Robert Lowell Kanzelman, Rochester, MN (US); Hari Mony, Austin, TX (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 287 days.

(21) Appl. No.: 11/050,606

(22) Filed: Feb. 3, 2005

(65) Prior Publication Data

US 2006/0190869 A1    Aug. 24, 2006

(51) Int. Cl.
*G06F 17/50* (2006.01)
(52) U.S. Cl. .............................. 716/5; 716/4
(58) Field of Classification Search ................ 716/1–5; 702/22; 703/13, 22; 717/104, 105, 124–126, 717/134–135; 714/724, 726, 728, 733, 738, 714/742
See application file for complete search history.

(56) References Cited

U.S. PATENT DOCUMENTS 6,253,365 B1 * 6/2001 Baldwin ..................... 716/18
7,017,096 B2 * 3/2006 Abramovici et al. ........ 714/738
7,047,139 B2 * 5/2006 Shtrichman .................. 702/22

* cited by examiner

Primary Examiner—Vuthe Siek
(74) Attorney, Agent, or Firm—Casimer K. Salys; Anthony V. S. England; Joseph P. Lolly

(57) ABSTRACT

System and software for verifying that a model of an integrated circuit satisfies its specification includes performing a sequence of at least one sequential transformation on a sequential model of the integrated circuit to produce a simplified sequential model of the integrated circuit. Thereafter, the simplified sequential model is unfolded for N time steps to create a combinational representation of the design. A sequence of at least one combinational transformation algorithms is then performed on the unfolded design to produce a simplified unfolded model. Finally, an exhaustive search algorithm is performed on the simplified unfolded model. The sequence of sequential transformations may include a sequential redundancy removal (SRR) algorithm and/or another sequential algorithm such as a retiming transformation. The combinational transformations may include a combinational redundancy removal algorithm or a logic re-encoding algorithm. The exhaustive search includes performing an exhaustive satisfiability search by propagating a binary decision diagram (BDD) through the netlist.

5 Claims, 3 Drawing Sheets

DESIGN VERIFICATION USING SEQUENTIAL AND COMBINATIONAL TRANSFORMATIONS

BACKGROUND

1. Field of the Present Invention

The present invention is in the field of integrated circuit design and, more particularly, systems and methods for verifying the correctness of a design.

2. History of Related Art

In the field of integrated circuit design, formal verification refers to the process of rigorously proving that a design satisfies its specification. Typically, the specification of a verification problem includes a netlist-based representation of the design and a set of expected values for specified nets. As an example, a verification problem may include a determination of whether a CHECKSTOP signal is ever asserted, where the CHECKSTOP signal is asserted only to indicate faults. Using formal verification, one either finds a counter-example trace depicting a sequence of values of the nets over time, similar to a simulation trace, that leads to an assertion of the CHECKSTOP signal or proves that no such trace exists.

Formal verification is often performed using state space search algorithms. Such algorithms include unbounded and bounded exhaustive searches. Bounded exhaustive searches try to find an assertion of CHECKSTOP that can occur within N time steps from an initial state of the design. Unbounded exhaustive algorithms increase N until no states are encountered that have not already been encountered for smaller values of N (a condition termed "fixed-point"). If no path from an initial state to a violating state (a state in which CHECKSTOP is asserted) is encountered before fixed-point is reached, then correctness can be inferred.

Exhaustive state space search techniques such as Boolean decision diagram (BDD) techniques and satisfiability techniques are well known. Generally, however, each step of an exhaustive state space search (whether bounded or unbounded) consumes exponential time and/or memory resources with respect to the number of registers or state holding elements in the netlist. Because of this exponential relationship, integrated circuits having a large number of registers present an enormous verification challenge. It would be desirable to implement a formal verification methodology that includes efficient design model simplification or transformation techniques to reduce the model to the greatest extent possible with given resource constraints.

SUMMARY OF THE INVENTION

The identified objective is addressed by a system and software for verifying that a model of an integrated circuit satisfies its specification includes performing a sequence of at least one sequential transformation on a sequential model of the integrated circuit to produce a simplified sequential model of the integrated circuit. Thereafter, the simplified sequential model is unfolded for N time steps to create a combinational representation of the design. A sequence of at least one combinational transformation algorithm is then performed on the unfolded design to produce a simplified unfolded model. Finally, an exhaustive search algorithm is performed on the simplified unfolded model. The sequence of sequential transformations may include a sequential redundancy removal (SRR) algorithm and/or another sequential algorithm such as a retiming or re-encoding transformation. The combinational transformations may include a combinational redundancy removal algorithm or a logic re-encoding algorithm. The exhaustive search includes performing an exhaustive satisfiability search by propagating a binary decision diagram (BDD) through the netlist.

BRIEF DESCRIPTION OF THE DRAWINGS

Other objects and advantages of the invention will become apparent upon reading the following detailed description and upon reference to the accompanying drawings in which.

Figure 1:
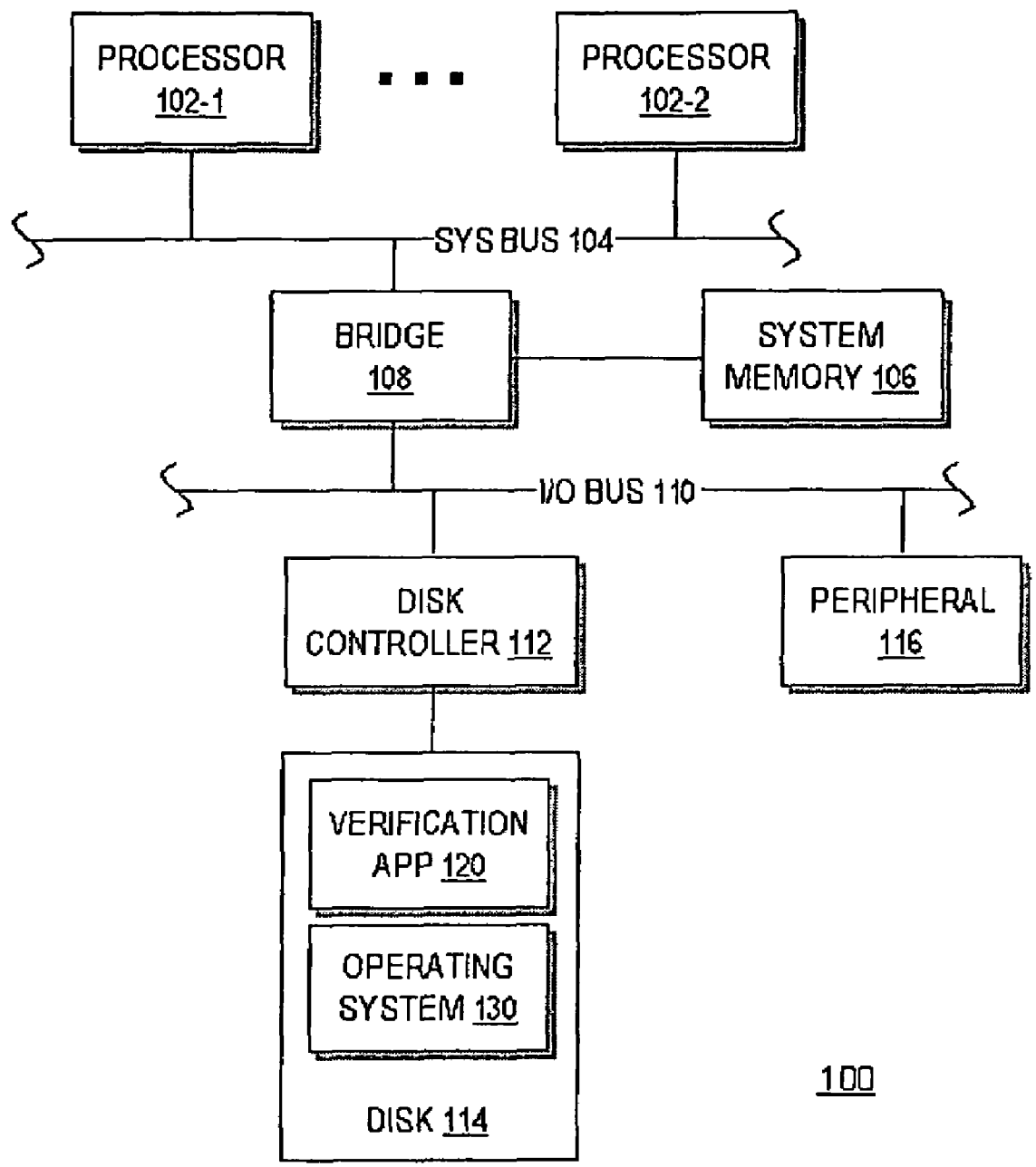
FIG. 1 is a block diagram of selected elements of a data processing system according to an embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF AN EMBODIMENT OF THE INVENTION

Generally speaking the described embodiment encompasses a system, method, and software for resolving a verification problem. The verification problem is most likely associated with a large scale integrated circuit. The system integrates a variety of verification tools in a prescribed manner to resolve the verification problem efficiently.

A sequence of one or more transformations are performed on a sequential model of the design to simplify the sequential model to the greatest extent possible. Assuming that the verification problem remains unresolved after sequential transformation, the simplified sequential model is "unfolded" for N time steps to create a combinational model of the design. Combinational transformations are then performed to simplify/verify the unfolded model.

If the combinational transformations fail to resolve the verification problem, an exhaustive satisfiability search is performed on the model. If the satisfiability search resolves the verification problem, either by discovering a sequence resulting in assertion of the checkstop signal or proving that the design is correct for the N time steps, the process may then be repeated for increasingly larger values of N until a counterexample trace is discovered, the verification resources (e.g., memory, CPU's) are exhausted or the diameter of the design is reached. Diameter is maximum depth for which the design needs to be unfolded. More specifically, the diameter of a design is typically defined as the maximum distance between any two of its states Si and Sj such that Sj is reachable from Si. The distance from Si to Sj is the minimum number of time-steps to transition the design from Si to Sj. A bounded model check of depth greater than or equal to diameter of a design is a complete check.

In some embodiments, the invention is implemented as a data processing system having design verification functionality. Referring to FIG. 1, selected elements of a data processing system 100 suitable for implementing design verification functionality according to the present invention (as described below with respect to FIG. 2 and FIG. 3) is depicted. In the depicted embodiment, system 100 includes general purpose processors 102-1 and 102-2 (generically or collectively referred to herein as processor(s) 102). The number of processors is implementation specific and other embodiments may have more or fewer processors 102.

Processors 102 share access to a high-speed system bus 104. A bus bridge 108 provides an interface between system bus 104 and a shared peripheral bus 110. Bus bridge 108 as depicted in FIG. 1 also includes memory control functionality and provides an interface between system bus 104 and a system memory 106. System memory 106 is most likely a volatile storage medium such as a relatively large array of DRAM elements. Peripheral bus 110 may be implemented as an industry standard peripheral bus such as a PCI (peripheral components interface) or PCI-X bus.

A disk controller 112 connected to peripheral bus 110 provides an interface to a hard disk 114. Disk 114 may store data and instructions used by processors 102. In the depicted embodiment, the instructions stored on disk 114 include an operating system 130 and a verification application 120 according to the present invention. Operating system 130 may be a commercially distributed operating system such as a Unix-based operating system, a Linux operating system, or a Windows® family operating system from Microsoft Corporation. The depicted embodiment of system 100 may include one or more additional peripheral devices represented by peripheral 116. Peripheral 116 may represent a network communication device (e.g., a network interface card) coupling system 100 to a network, a graphics adapter providing graphic display capabilities to system 100, or a number of other well known peripheral devices.

As suggested in the preceding paragraph, verification application 120 may be implemented as a set or sequence of computer executable instructions, stored on a computer readable medium, for verifying that a design meets its specification. The instructions may be stored on a persistent storage medium such as hard disk 114, a CD ROM (not depicted), floppy diskette (not depicted), magnetic tape (not depicted), and the like. The instructions may also be stored on a volatile storage medium such as system memory 106 or a cache memory (not depicted) of data processing system 100.

Figure 2:
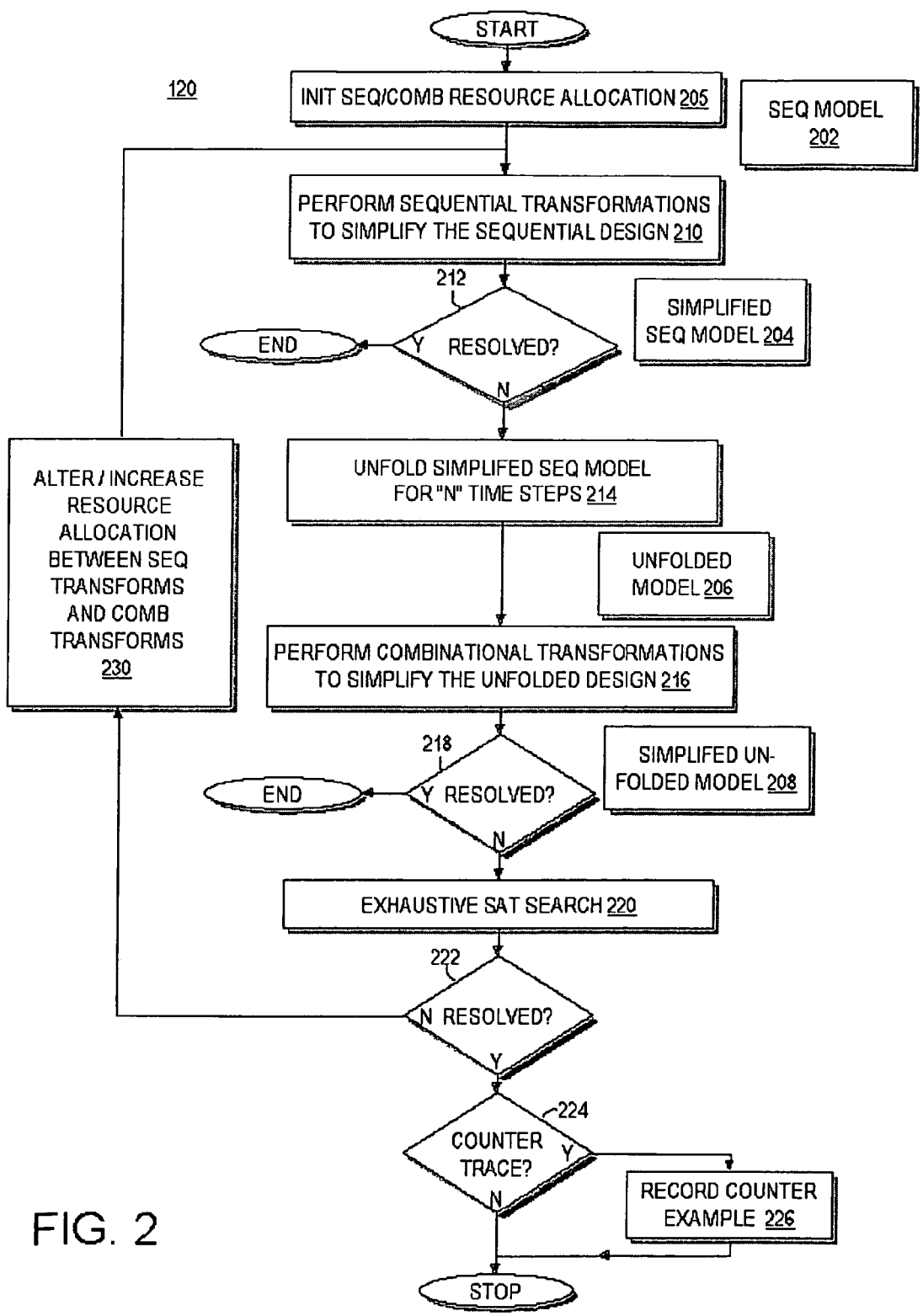
FIG. 2 is a flow diagram of a design verification application according to one embodiment of the present invention.

Turning now to FIG. 2, a flow diagram conceptually depicting an embodiment of verification application 120 and a corresponding design verification method, are depicted. Verification application 120 is characterized by the integrated or synergistic use of sequential and combinational transformation algorithms to simplify a design prior to executing an exhaustive state space search. The use of sequential and combinational transformations in conjunction with one another produces potentially dramatic reductions in the amount of computational resources required to resolve a verification problem whether the computational resources are measured in terms of storage required or processor cycles (i.e., time).

In the depicted embodiment, verification application 120 initially operates on a sequential model 202 of a design. Before beginning the verification process, the depicted embodiment of verification application 120 determines (block 205) an initial allocation of verification resources. As described in more detail below, application 205 performs verification using a hybrid of sequential transformation algorithms, which operate on a sequential model of a design, and combinational transformation algorithms, which operate on a combinational model. Initially, a determination is made to bound the resources allocated to either of these approaches.

Resources can be bound or constrained in terms of time (CPU cycles), memory, or a combination of both. In an exemplary implementation, resources are initially bound in terms of time. A specified interval of time is allocated for performing sequential transformations. At the conclusion of this interval, assuming the verification task has not been discharged, the simplified model resulting from the sequential transformation is converted to a combinational model and subjected to combinational transformations. The constraints on combinational transformations may include, in addition to time constraints, time step constraints limiting the number of time steps for which the sequential model is unfolded to create a combinational model suitable for analysis with the combinational algorithms.

Returning now to FIG. 2, a sequential model of a design is presented to verification application 120. A sequential model is a netlist-based representation of a design that includes state holding elements such as registers. Verification application 120 performs (block 210) one or more sequential transformations on sequential model 202 to produce a simplified sequential model 204. The amount of sequential transformation testing that is done is a function of any constraints specified either initially in block 205 or subsequently.

An example of a sequential transformation model suitable for using in block 210 is a sequential redundancy removal (SRR) algorithm. The SSR algorithm uses a semi-formal search to identify potentially redundant gates in the netlist. Coverage data from random simulation or some other under-approximate search algorithm is examined to identify any gates that exhibit no toggle activity (implying that the function at these gates may be a constant) or any two or more gates that exhibit equivalent toggle activity (implying that the function at these gates is equivalent).

In the case of a potentially constant gate, the SRR algorithm may create a new gate that evaluates to the expression "GATE=PRESUMED CONSTANT VALUE." The new gate thus becomes a secondary verification task. In the cases of potentially equivalent gates, a new gate is created that evaluates to "GATE1=GATE2" (where Gate1 and Gate2 are the two potentially equivalent gates) and this gate becomes a verification task. Next, SRR uses an over approximate search in the form of k-step induction based on satisfiability analysis to solve the secondary verification tasks. A k-step induction process determines whether, if it is not possible to reach a particular state in less than k-steps, it is possible to reach the state in exactly k-steps.

If induction succeeds in proving a secondary target that checks for a gate being equal to constant, the gate is merged to the constant value. Similarly, if induction succeeds in proving a secondary target that checks for equivalent gates, the equivalent gates are merged into a single gate. In either case, the design size is beneficially reduced. Other sequential transformations include algorithms such as retiming, which moves the state holding elements across combinational gates in an effort to reduce their total count and re-encoding transformations.

Following the completion of sequential transformations in block 210 (or the expiration of a time limitation), and assuming that the sequential transformations did not resolve (block 212) the original verification problem, the simplified sequential model 204 produced by block 210 is converted to a combinational model (also referred to as an unfolded model 206) by "unfolding" (block 214) simplified sequential model 204 for "N" time steps. A model is unfolded by introducing new variables for each input for each time step and feeding a copy of the netlist for the preceding time step to the next state function of the state holding elements in subsequent time step.

Verification application 120 further includes performing combinational transformations (block 216) on the unfolded design 206 to verify or simplify the problem further and thereby produce a simplified unfolded model 208. An exemplary combinational transformation may include elements of a combinational redundancy removal algorithm such as the algorithm disclosed in Kuehlmann, Paruthi, Krohm and Ganai, *Robust Boolean Reasoning for Equivalence Checking and Functional Property Verification*, IEEE Transactions on Computer-Aided Design of Integrated Circuits and Systems 21(12): 1377-1394 (2002). The use of the combinational model is beneficial to discover redundancies that are not exploitable in the sequential model. For example, a gate may be constant only during the first N time-steps following a particular state of the design. When performing N-step unfolding, such a gate may be replaced by a constant for those time steps even though the gate cannot be merged to a constant in the sequential design.

By using sequential and combinational techniques synergistically, verification application 120 efficiently reduces or simplifies a design model. Use of the sequential transformation algorithms produces a "magnified" reduction in the subsequent unfolded, combinational circuit. Merging just a single gate, for example, results in a reduction of N gates in the N-step unfolded design. A reduction of N gates, in turn, reduces the search space for the model exponentially and thereby greatly increases the probability that subsequent verification on the combinational model will achieve resolution and that subsequent transformation algorithms performed on the combinational model will succeed in simplifying the model still further.

If (block 218) the combinational transformations of block 216 do not resolve the verification problem, a formal or exhaustive algorithm is then performed (block 220) on the simplified unfolded model 208. In the depicted embodiment, the exhaustive search is a satisfiability-based algorithm. Satisfiability-based algorithms (SAT-solvers) have gained wide acceptance as they have improved greatly in speed and scalability. SAT-solvers are now able to take advantage of shared information between the different steps (e.g., information learned by a SAT-solver about the behavior of the design during time step N may be used to simplify its analysis at time step N+1).

In one embodiment, the exhaustive algorithm of block 220 is performed by a structural SAT-solver on a netlist representation of the unfolded circuit. In such a solver, BDD sweeping and structural satisfiability techniques are applied in an interleaved manner on a shared graph representation of the netlist. In one embodiment, the shared graph representation is comprised entirely of 2-input AND gates and INVERTER gates. Interleaved application of BDD and SAT techniques results in a synergistic summation of their orthogonal strengths. BDD algorithms work well if redundancy of the problem structure eludes exponential growth during construction. Structural SAT algorithms are efficient if the underlying netlist structure can be exploited for effective local search heuristics.

In addition, as redundancies are identified on the combinational problem (e.g., two nodes are identified as have identical BDDs), the redundancies are eliminated and the problem domain is reduced by merging the corresponding redundant nodes. In a synergistic setting such as the one described herein, an interleaved application of "BDD sweeping" thereby incrementally reduces the search space for the SAT-solver until the problem is solved.

In one embodiment, SAT-solver 220 is based on a procedure, referred to herein as a Davis-Putnam procedure, that attempts to find a consistent assignment using a branch-and-bound approach. Unsatisfiability is proven if the SAT-solver exhaustively enumerates all possible cases without finding a satisfying assignment. The SAT-solver uses interleaved application of propagating BDD's through the netlist, and satisfiability searching, using gradually increasing resources for each algorithm. BDD-sweeping is used to look for and merge functionally equivalent nodes in the netlist. This compresses the netlist and increases the chances of the SAT-algorithm succeeding in finding a solution or proving that no solution exists.

SAT-solver 220 may resolve or discharge the verification task by either finding a counter example trace or by determining that the design meets its specification (e.g., by conclusively determining that a CHECKSTOP signal cannot be asserted). If (block 222) the SAT-solver is able to discharge the verification task by finding (block 224) a counter example trace, the counter example trace is displayed, printed, stored to a disk or other storage, or otherwise recorded (block 226). If the SAT-solver resolves the task by formally verifying that the design meets its specification, the process concludes.

If SAT-solver 220 is not able to resolve the verification task conclusively, subsequent iterations of the entire process may be initiated. Prior to initiating a subsequent iteration, verification application 120 will alter (block 230) the resources devoted to the sequential transformation process, the combinational transformation process, or both. For example, a second or subsequent iteration of verification application 120 may allocate more resources (e.g., longer time) to performing sequential transformations. By increasing the amount of time for performing sequential transformations, additional sequential redundancy may be discovered, which, in turn may enable the formal verification of the unfolded design for a larger value of N. Eventually this technique may be able to formally verify an N step model of the design where N is greater than or equal to the model's diameter. By using the sequential algorithms and the combinational algorithms in conjunction with one another and by gradually increasing the resources allocated for either of the transformation approaches, the present invention enables the resolution or discharge of verification tasks that might not otherwise be resolvable.

Figure 3:
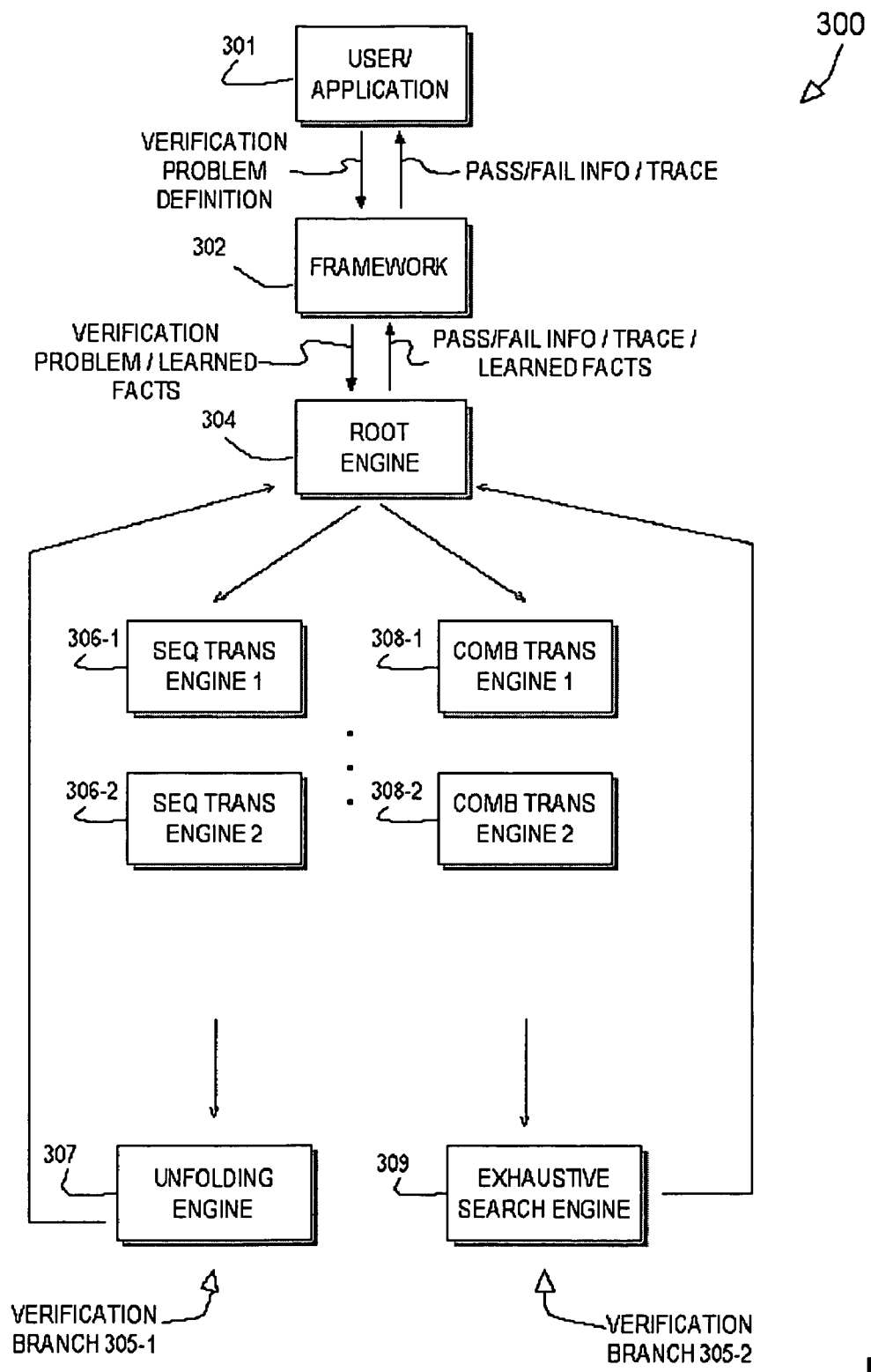
FIG. 3 illustrates a modular, transformation based verification (TBV) implementation of the invention.

Turning now to FIG. 3, a conceptual illustration of selected portions of a design verification system 300 according to one embodiment of the invention is presented. Design verification system 300 implements the concepts of verification application 120 within a modular design verification framework. In the depicted embodiment, system 300 includes a design verification framework 302. Framework 302 typically includes an interface to communicate with one or more application programs 301 that are invoked by a system user. For example, application program 301 might define the verification problem. Framework 302 is further configured to provide a verification problem to a verification engine identified in FIG. 3 as root engine 304. The verification problem typically includes a netlist or another suitable representation of a circuit structure and a set of expected values at one or more of the circuit's nets that are to be proven or dis-proven. An expected value is proven if a state or sequence of states produces the expected value on the specified circuit net(s).

Framework 302 is configured to create instances of (instantiate) a set of verification engines in one or more sequences typically defined by the user via application program 301. The instantiated engines are typically arranged in a tree-like architecture having one or more verification branches from which other branches may split off. At the apex of this tree structure is a root verification engine 304 that receives a verification problem from framework 302. Framework 302 controls the flow of a verification problem among the verification engines in a branch.

As illustrated in FIG. 3, framework 302 is configured to interact with a user through application program 301 to create one or more verification branches 305, each of which includes a user-defined sequence of one or more verification engines represented in FIG. 3 by reference numerals 304, 306, and 308. The engines that may be instantiated or invoked by framework 302 include sequential transformation engines 306, and combinational transformation engines 308. As their names suggest, sequential transformation engines 306 operate on a sequential model of the design to modify (and presumably simplify) a given verification problem while combinational transformation engines 308 act on a combinational model of the design.

Framework 302 is responsible for applying each of the one or more verification branches 305 to a verification problem. Within each branch 305, the verification problem may be modified by one or more transformation engines 306 or 308. In the depicted embodiment, verification branch 305-1 terminates with an unfolding engine 307 that unfolds the simplified sequential model produced by sequential transformation engines 306. Verification branch 305-2, on the other hand, terminates with an exhaustive search engine 309 that attempts to solve a verification problem.

After framework 302 has applied sequential transformation engines 306 and unfolding engine 307 to produce an N-step combinational model of the simplified sequential model, framework 302 applies the combination verification branch 305-2.

As indicated previously, framework and the various verification engines are preferably compliant with a common API to facilitate the exchange of information passed from one engine to the next. In this embodiment, each verification engine must support a specified set of functions so that verification tasks will be handled in a consistent manner by each of the engines. The API, for example, may specify a function to create the logical AND of two nets in a netlist.

It will be apparent to those skilled in the art having the benefit of this disclosure that the present invention contemplates a mechanism for verifying the design of an integrated circuit. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A method for verifying a design model of an integrated circuit, comprising:
   performing a sequence of at least one sequential transformation on a sequential model of the integrated circuit to produce a simplified sequential model of the integrated circuit;
   unfolding the simplified sequential model for N time steps to produce a combinational model of the integrated circuit;
   performing a sequence of at least one combinational transformation on the combinational model to produce a simplified combinational model; and
   performing an exhaustive search of states of the simplified combinational model, wherein performing the exhaustive search comprises performing an exhaustive satisfiability search, and wherein the exhaustive satisfiability search includes propagating a binary decision diagram (BDD) through a net list; and
   storing a result of the verifying process in response to i) performing a predetermined number of iterations of the verifying process, or else ii) the verifying process encountering a cheekstop or not new states.

2. The computer program product of claim 1, further comprising, responsive to the exhaustive algorithm not resolving the verification problem, computer code means for performing a subsequent iteration including additional sequential transformation to further simplify the sequential model and performing combinational transformations on the further simplified model.

3. The computer program product of claim 1, wherein the sequence of sequential transformations includes a sequential redundancy removal transformation.

4. The computer program product of claim 1, wherein the sequence of sequential transformations includes a retiming transformation.

5. The computer program product of claim 1, wherein the sequence of combinational transformations includes a logic re-encoding transformation.

* * * * *